United States Patent
Tseng et al.

(10) Patent No.: US 9,835,345 B2
(45) Date of Patent: Dec. 5, 2017

(54) BI-DIRECTIONAL FAN COOLING METHOD FOR MULTI-AXIS CONTROLLER

(71) Applicant: HIWIN TECHNOLOGIES CORP., Taichung (TW)

(72) Inventors: I-Hsiang Tseng, Taichung (TW); Chin-Yen Su, Taichung (TW)

(73) Assignee: Hiwin Technologies Corp., Taichung (TW)

( * ) Notice: Subject to any disclaimer, the term of this patent is extended or adjusted under 35 U.S.C. 154(b) by 180 days.

(21) Appl. No.: 14/815,190

(22) Filed: Jul. 31, 2015

(65) Prior Publication Data
US 2017/0030602 A1    Feb. 2, 2017

(51) Int. Cl.
*G05D 23/00* (2006.01)
*F24F 11/00* (2006.01)

(52) U.S. Cl.
CPC ...... *F24F 11/0001* (2013.01); *F24F 11/0012* (2013.01)

(58) Field of Classification Search
CPC .............. F24F 11/0001; F24F 11/0012; H05K 7/20136; H05K 7/20145; H05K 7/20172; H05K 7/20209; H05K 7/20863; H05K 7/0563; H05K 7/20727; H05K 7/20909; H05K 7/20972
See application file for complete search history.

(56) References Cited

U.S. PATENT DOCUMENTS

| 3,991,819 | A  | * | 11/1976 | Clark | F25B 29/00 165/240 |
| 6,628,519 | B2 | * | 9/2003 | Umetsu | G06F 1/203 361/679.51 |
| 7,675,747 | B1 | * | 3/2010 | Ong | F04D 19/024 361/679.46 |
| 7,894,191 | B2 |   | 2/2011 | Tsuchiya | |
| 2005/0241810 | A1 | * | 11/2005 | Malone | H05K 7/20727 165/122 |
| 2006/0128261 | A1 |   | 6/2006 | Kawabe et al. | |
| 2006/0169789 | A1 | * | 8/2006 | Barsun | G06F 1/20 236/49.3 |
| 2007/0103863 | A1 | * | 5/2007 | Kim | G06F 1/1601 361/679.21 |
| 2007/0131409 | A1 | * | 6/2007 | Asahi | G05D 23/19 165/287 |
| 2009/0097202 | A1 | * | 4/2009 | Gipson | B01D 46/0067 361/695 |
| 2010/0032489 | A1 | * | 2/2010 | Lee | F24F 11/0012 236/44 C |

(Continued)

*Primary Examiner* — Travis Ruby
(74) *Attorney, Agent, or Firm* — Muncy, Geissler, Olds & Lowe, P.C.

(57) ABSTRACT

A cooling method for multi-axis controller includes a first step of enabling a first temperature sensor and a second temperature sensor to respectively detect the temperature of a first heat source and the temperature of a second heat source and to send the respective detected data to a control unit, and a second step of enabling the control unit to drive a first bi-direction fan to exhaust air if the temperature of the first heat source surpasses a predetermined upper temperature limit or to drive a second bi-directional fan to exhaust air if the temperature of the second heat source surpasses the predetermined upper temperature limit, thereby achieving enhanced cooling efficiency.

4 Claims, 6 Drawing Sheets

(56) References Cited

U.S. PATENT DOCUMENTS

| | | | | |
|---|---|---|---|---|
| 2011/0114297 A1* | 5/2011 | Horng | ............... | H01L 23/467 165/121 |
| 2012/0275115 A1* | 11/2012 | Chen | ............... | G06F 1/206 361/697 |
| 2013/0153180 A1* | 6/2013 | Montocchio | ............... | B60K 11/04 165/121 |
| 2014/0036443 A1* | 2/2014 | Xu | ............... | G06F 1/206 361/695 |

* cited by examiner

BI-DIRECTIONAL FAN COOLING METHOD FOR MULTI-AXIS CONTROLLER

BACKGROUND OF THE INVENTION

1. Field of the Invention

The present invention relates to electronic device cooling technology, and more particularly, to a cooling method for multi-axis controller.

2. Description of the Related Art

On the controller cooling technology for robots, US2006/0128261 discloses a cooling arrangement for a humanoid robot, which has a powered fan provided inside each air vent hole in a shell of a humanoid robot so that the cooling air can flow laterally across the inner space, and a uniform cooling effect can be achieved. However, to achieve the expected cooling effect, a certain amount of air vent holes and powered fans must be provided, increasing the cost. Further, U.S. Pat. No. 7,894,191 a fan rotation control method for controlling a rotation of each of a plurality of system cooling fans by: storing a supply cooling amount, calculating a necessary cooling amount, the supply cooling amount and the temperature of the operation unit, determining the fan rotation number and controlling the rotation of each system cooling fan. However, this approach is more suitable for use in stable heat sources. If the temperature of each heat source is not stable, this approach can lead to deterioration of the cooling efficiency

SUMMARY OF THE INVENTION

The present invention has been accomplished under the circumstances in view. It is the main object of the present invention to provide a cooling method for multi-axis controller, which is applicable to heat sources of uncertainty in temperature, enhancing the cooling efficiency.

To achieve this and other objects of the present invention, a cooling method for multi-axis controller comprises two steps. At first, enable a first temperature sensor and a second temperature sensor to respectively detect the temperature of a first heat source and the temperature of a second heat source and then to provide the respective detected data to a control unit for comparison with a predetermined upper temperature limit. Thereafter, enable the control unit to drive a first bi-directional fan adjacent to the first heat source to exhaust air and then return to the first step if the temperature of the first heat source is higher than the predetermined upper temperature limit, or, enable the control unit to drive a second bi-directional fan adjacent to the second heat source to exhaust air and then return to the first step if the temperature of the second heat source is higher than the predetermined upper temperature limit.

Preferably, enable the control unit to determine whether or not the absolute temperature difference value between the temperature of the first heat source and the temperature of the second heat source surpasses a predetermined temperature difference limit if the temperature of the first heat source and the temperature of the second heat source are below the predetermined upper temperature limit, and then return to the first step if the absolute temperature difference value between the temperature of the first heat source and the temperature of the second heat source is below the predetermined temperature difference limit. If the absolute temperature difference value between the temperature of the first heat source and the temperature of the second heat source surpasses the predetermined temperature difference limit and the temperature of the first heat source surpasses the temperature of the second heat source, enable the control unit to drive the first bi-directional fan to exhaust air and the second bi-directional fan to intake air and then return to the first step. If the absolute temperature difference value between the temperature of the first heat source and the temperature of the second heat source surpasses the predetermined temperature difference limit and the temperature of the first heat source is below the temperature of the second heat source, enable the control unit to drive the first bi-directional fan to intake air and the second bi-directional fan to exhaust air and then return to the first step.

Other advantages and features of the present invention will be fully understood by reference to the following specification in conjunction with the accompanying drawings, in which like reference signs denote like components of structure.

DETAILED DESCRIPTION OF THE INVENTION

Figure 1:
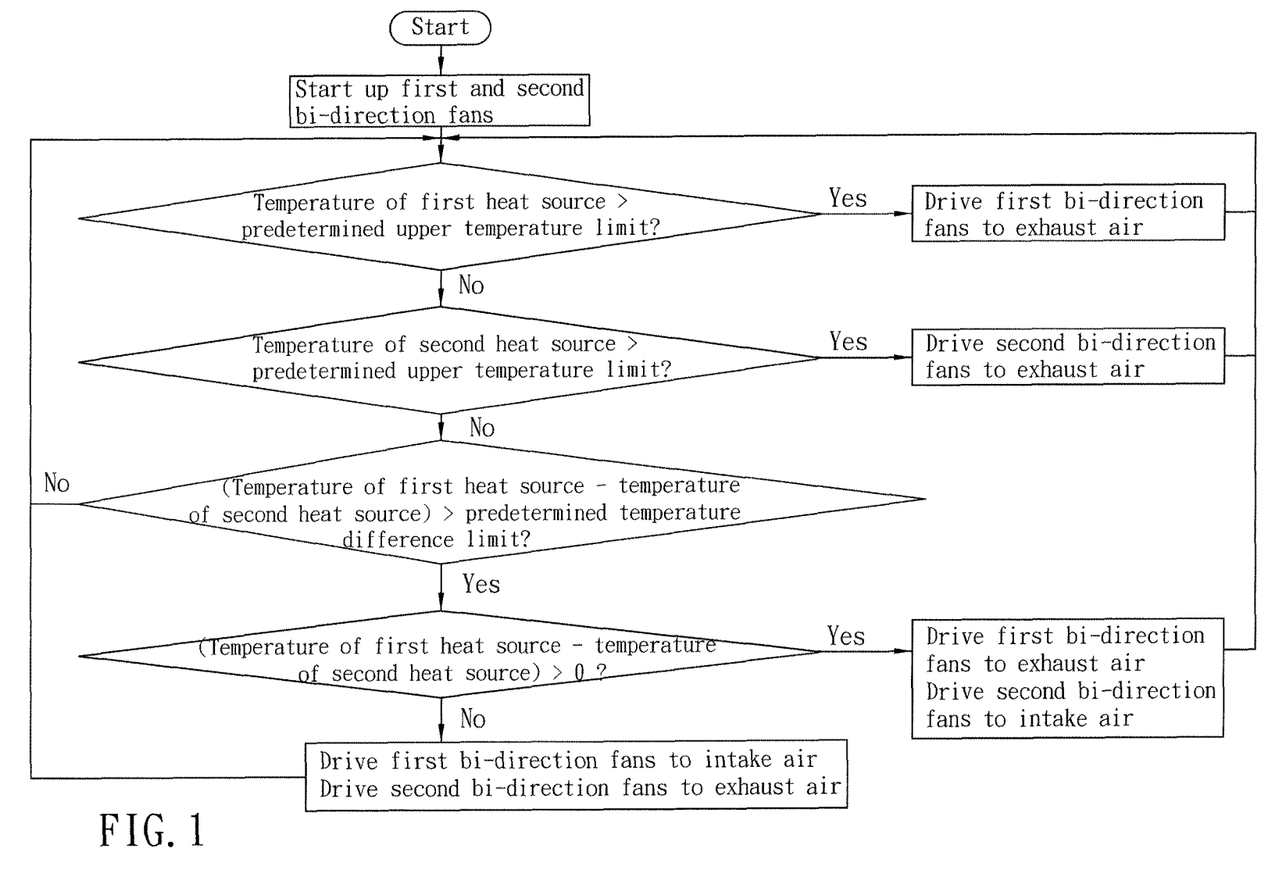
FIG. 1 is a flow chart of a cooling method for multi-axis controller in accordance with the present invention.
Figure 2:
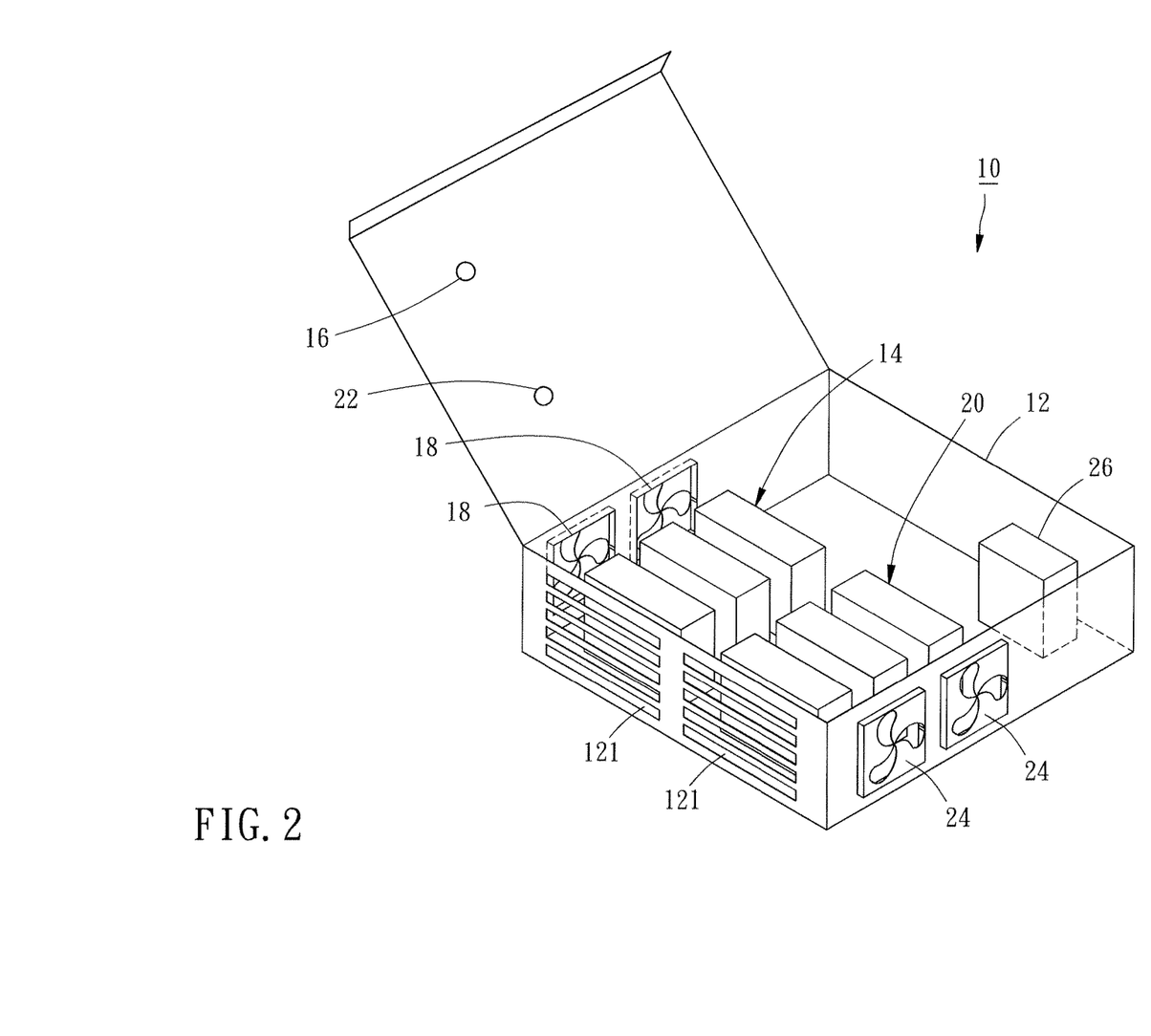
FIG. 2 is a perspective view of a multi-axis controller using the cooling method of the present invention.
Figure 3:
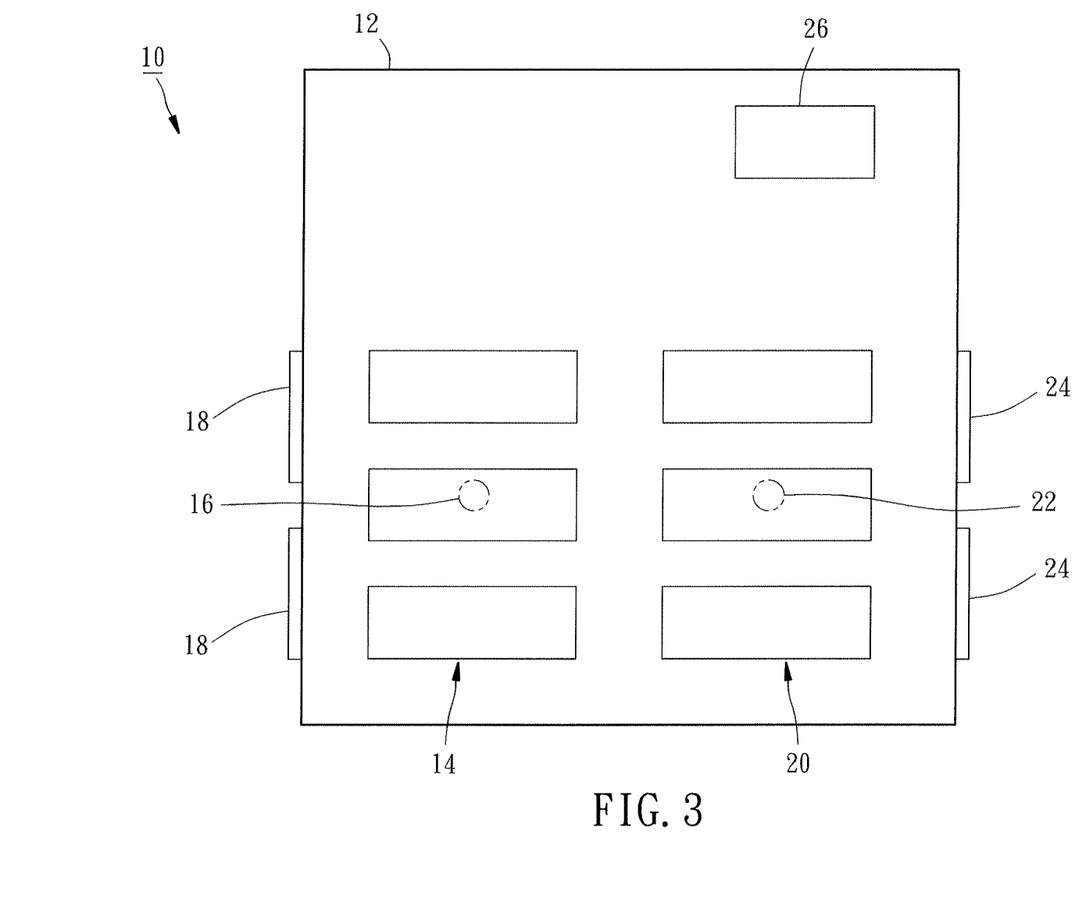
FIG. 3 is a schematic plain view of the multi-axis controller shown in FIG. 2.
Figure 4:
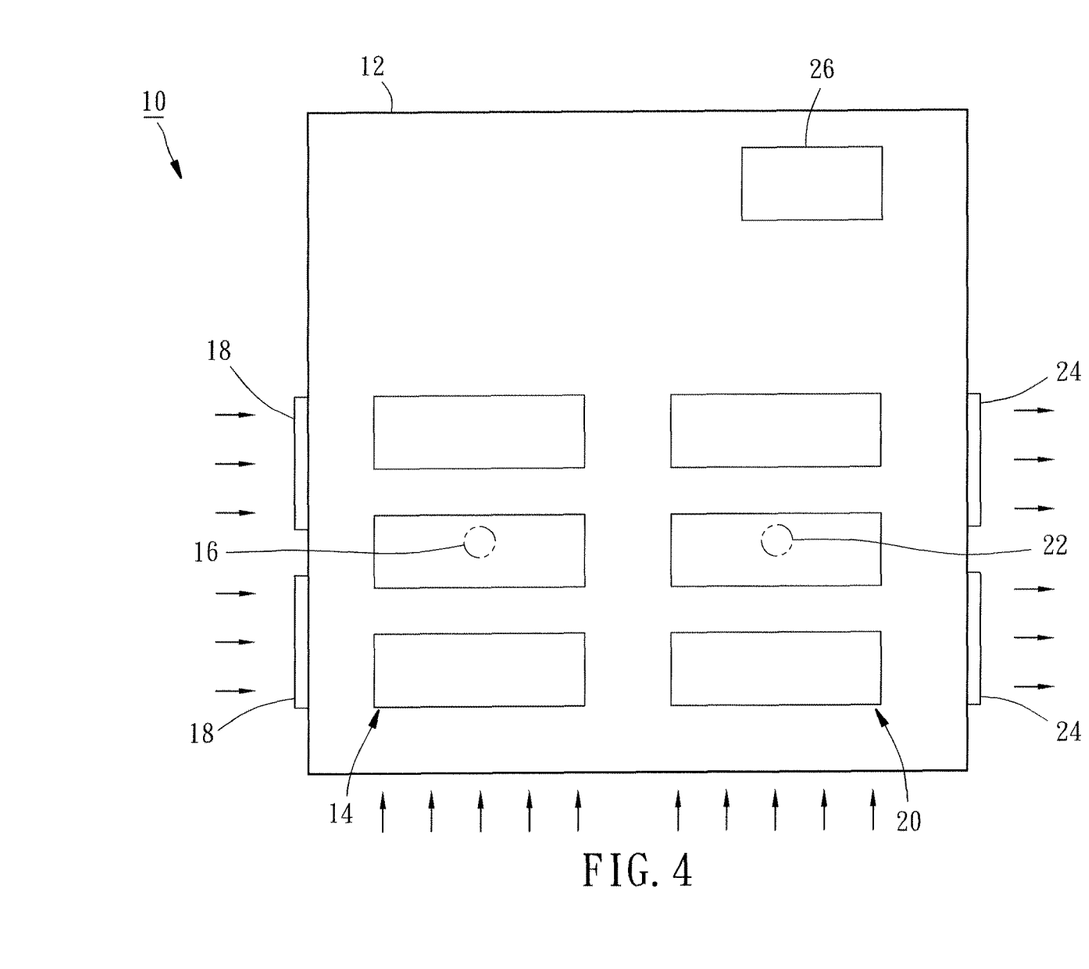
FIG. 4 is similar to FIG. 3, illustrating the first bi-directional fans in the air intake mode and the second bi-directional fans in the exhaust mode.

Referring to FIGS. 2 and 3, a cooling method of the invention is adapted for use in a multi-axis controller 10. The multi-axis controller 10 comprises, in structure, a housing 12, a first heat source 14 mounted in the housing 12, a first temperature sensor 16 fixedly mounted in the housing 12 adjacent to the first heat source 14, two first bi-directional fans 18 facing toward the first heat source 14, a second heat source 20 mounted in the housing 12, a second temperature sensor 22 fixedly mounted in the housing 12 adjacent to the second heat source 20, two second bi-directional fans 24 facing toward the second heat source 20, and a control unit 26 electrically coupled with the first temperature sensor 16, the second temperature sensor 22, the first bi-directional fans 18 and the second bi-directional fans 24. It is to be noted that the first bi-directional fans 18 and the second bi-directional fans 24 are respectively mounted in two opposite peripheral walls of the housing 12; the housing 12 has air vents 121 located one peripheral wall thereof between the first bi-directional fans 18 and the second bi-directional fans 24. Referring to FIG. 1 again, the cooling method comprises the steps described as follows:

Step a): After the multi-axis controller 10 is started up, the control unit 26 controls the first bi-directional fans 18 and the second bi-directional fans 24 to work as air intake fans or exhaust fans as predetermined. In this embodiment, the first bi-directional fans 18 are controlled to work as air intake fans for drawing external cold air into the inside of the housing 12 and the second bi-directional fans 24 are controlled to work as exhaust fan for expelling internal hot air out of the housing 12 (see FIG. 4). Thereafter, the control unit 26 controls the first temperature sensor 16 and the second temperature sensor 22 to detect the temperature of the first heat source 14 and the temperature of the second heat source 20 and to feed back the detected temperature data for comparison with a predetermined upper temperature limit.

Figure 5:
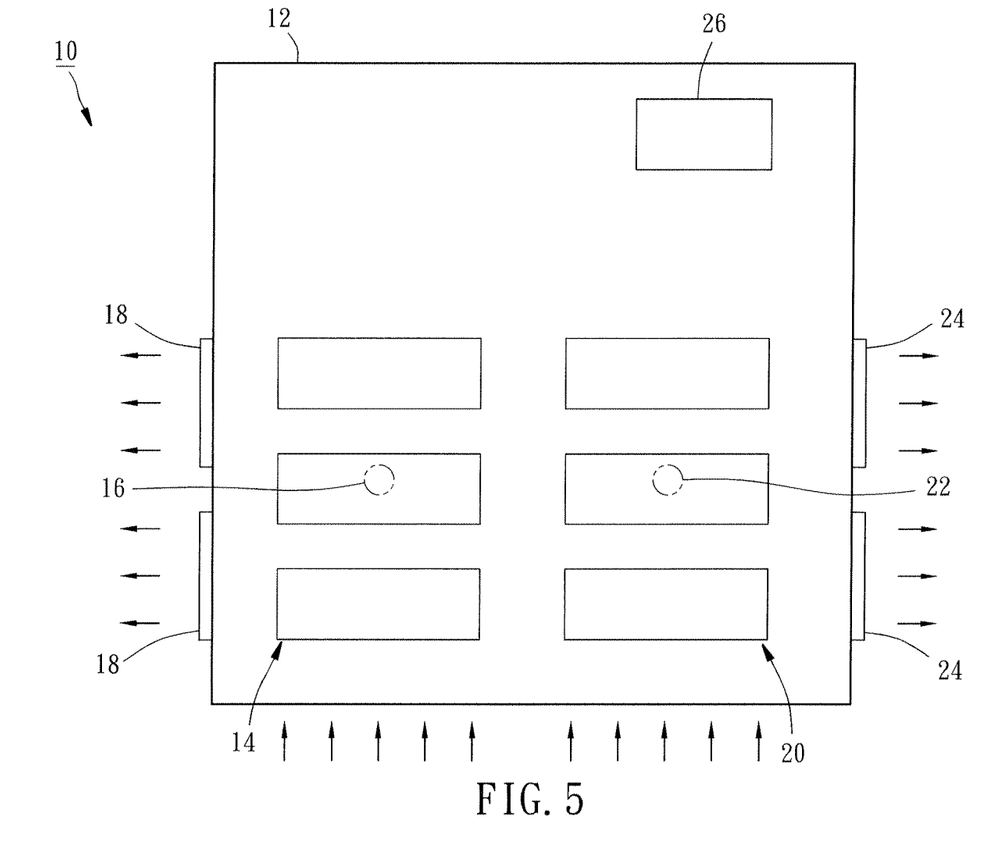
FIG. 5 is similar to FIG. 3, illustrating the first bi-directional fans and the second bi-directional fans in the exhaust mode.

Step b): The control unit 26 determines, at first, whether or not the temperature of the first heat source 14 surpasses the predetermined upper temperature limit, and then controls the first bi-directional fans 18 to exhaust air if the temperature of the first heat source 14 surpasses the predetermined upper temperature limit (see FIG. 5), thereby generating convection to carry waste heat from the first heat source 14. At this time, the second bi-directional fans 24 are maintained to exhaust air. Thereafter, return to step a) for enabling the control unit 26 to repeatedly determine whether or not the temperature of the first heat source 14 surpasses the predetermined upper temperature limit.

If the temperature of the first heat source 14 is below the predetermined upper temperature limit, the control unit 26 immediately determines whether or not the temperature of the second heat source 20 surpasses the predetermined upper temperature limit. If the temperature of the second heat source 20 surpasses the predetermined upper temperature limit at this time, the control unit 26 immediately controls the second bi-directional fans 24 to exhaust air (see FIG. 4). At this time, the first bi-directional fans 18 are maintained in the air intake mode, allowing generation of a convection to carry waste heat from the second heat source 20. Thereafter, the control unit 26 returns to step a) for determining whether or not the temperature of the first heat source 14 surpasses the predetermined upper temperature limit.

Step c): If the temperature of the first heat source 14 and the temperature of the second heat source 20 are below the predetermined upper temperature limit, the control unit 26 immediately determines whether or not the absolute temperature difference value between the temperature of the first heat source 14 and the temperature of the second heat source 20 surpasses a predetermined temperature difference limit. If the absolute temperature difference value is below the predetermined temperature difference limit, the control unit 26 returns to step a) for determining whether or not the temperature of the first heat source 14 surpasses the predetermined upper temperature limit.

Figure 6:
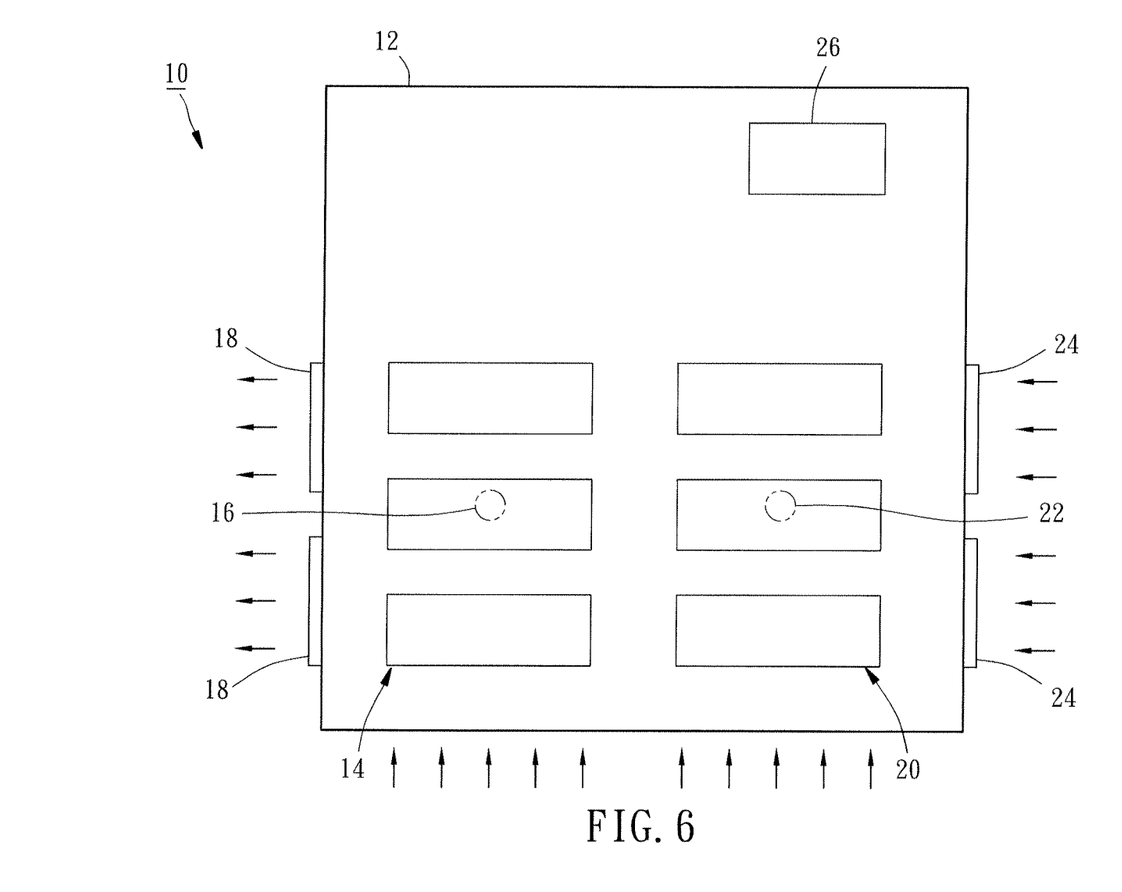
FIG. 6 is similar to FIG. 3, illustrating the first bi-directional fans in the exhaust mode and the second bi-directional fans in the air intake mode.

If the absolute temperature difference value between the temperature of the first heat source 14 and the temperature of the second heat source 20 surpasses the predetermined temperature difference limit, the control unit 26 subtracts the temperature of the second heat source 20 from the temperature of the first heat source 14 and then determines whether or not the remainder is larger than zero. If the remainder is larger than zero, it means that the temperature of the first heat source 14 is higher than the temperature of the second heat source 20. At this time, the control unit 26 controls the first bi-directional fans 18 to exhaust air and the second bi-directional fans 24 to intake air (see FIG. 6), thereafter, the control unit 26 returns to step a) for determining whether or not the temperature of the first heat source 14 surpasses the predetermined upper temperature limit.

If the remainder obtained by subtracting the temperature of the second heat source 20 from the temperature of the first heat source 14 is smaller than zero, it means that the temperature of the second heat source 20 is higher than the temperature of the first heat source 14. At this time, the control unit 26 controls the first bi-directional fans 18 to intake air and the second bi-directional fans 24 to exhaust air (see FIG. 4). If the absolute temperature difference value between the temperature of the first heat source 14 and the temperature of the second heat source 20 is below the predetermined temperature difference limit at this time, the control unit 26 immediately returns to step a) for determining whether or not the temperature of the first heat source 14 surpasses the predetermined upper temperature limit, and thus, one operating cycle is completed.

It can be seen by the steps described above that the cooling method of the invention enables multiple temperature sensors 16,22 to detect the temperatures of multiple heat sources 14,20 of uncertainty in temperature and then to provide the detected temperature data to a control unit 26 so that the control unit 26 can control respective bi-directional fans 18,24 to exhaust air or to intake air subject to an analysis on the detected temperature data, achieving enhanced cooling efficiency.

What is claimed is:

1. A cooling method of a multi-axis controller, the multi-axis controller comprising a housing, a first heat source provided inside the housing, a first temperature sensor mounted to the housing adjacent to the first heat source, two first bi-directional fans facing toward the first heat source, a second heat source provided inside the housing, a second temperature sensor mounted to the housing adjacent to the second heat source, two second bi-directional fans facing toward the second heat source, and a control unit electrically coupled with the first and second temperature sensors and the first and second bi-directional fans, the first bi-directional fans and the second bi-directional fans being respectively mounted to two opposite peripheral walls of the housing, the housing having at least one air vent between the first bi-directional fans and the second bi-directional fans, the cooling method comprising the steps of:
  a): enabling the first temperature sensor and the second temperature sensor to respectively detect the temperature of the first heat source and the temperature of the second heat source and then to provide the respective detected data to the control unit for comparison with a predetermined upper temperature limit;
  b): enabling said control unit to drive the first bi-directional fans adjacent to said first heat source to exhaust air and then returning to step a) if the temperature of said first heat source is higher than said predetermined upper temperature limit, or, enabling said control unit to drive the second bi-directional fans adjacent to said second heat source to exhaust air and then returning to step a) if the temperature of said second heat source is higher than said predetermined upper temperature limit.

2. The cooling method for multi-axis controller as claimed in claim 1, further comprising step c): enabling said control unit to determine whether or not the absolute temperature difference value between the temperature of said first heat source and the temperature of said second heat source surpasses a predetermined temperature difference limit if the temperature of said first heat source and the temperature of said second heat source are below said predetermined upper temperature limit, and then returning to step a) if the absolute temperature difference value between the temperature of said first heat source and the temperature of said second heat source is below said predetermined temperature difference limit; if the absolute temperature difference value between the temperature of said first heat source and the temperature of said second heat source surpasses said predetermined temperature difference limit and the temperature of said first heat source surpasses the temperature of said second heat source, enabling said control unit to drive said first bi-directional fans to exhaust air and said second bi-directional fans to intake air and then returning to step a);
if the absolute temperature difference value between the temperature of said first heat source and the temperature of said second heat source surpasses said predetermined temperature difference limit and the temperature of said first heat source is below the temperature of said second heat source, enabling said control unit to drive said first bi-directional fans to intake air and said second bi-directional fans to exhaust air and then returning to step a).

3. The cooling method for multi-axis controller as claimed in claim 1, wherein in step b), enable said control unit to firstly determine whether or not the temperature of said first heat source surpasses said upper temperature limit, and then enable said control unit to determine whether or not the temperature of said second heat source surpasses said upper temperature limit if the temperature of said first heat source is below said upper temperature limit.

4. The cooling method for multi-axis controller as claimed in claim 1, wherein, before the implementation of step b), enable said control unit to drive said first bi-directional fans and said second bi-directional fans to intake air or exhaust air according to a predetermined setting.

* * * * *